US012593533B2

(12) United States Patent
Woo et al.

(10) Patent No.: US 12,593,533 B2
(45) Date of Patent: Mar. 31, 2026

(54) LIGHT EMITTING DIODE DEVICE AND METHOD FOR THE SAME

(71) Applicant: Samsung Display Co., Ltd., Yongin-si (KR)

(72) Inventors: Yeoung Keol Woo, Seoul (KR); Chul Min Bae, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 701 days.

(21) Appl. No.: 17/102,293

(22) Filed: Nov. 23, 2020

(65) Prior Publication Data

US 2021/0074879 A1     Mar. 11, 2021

Related U.S. Application Data

(63) Continuation of application No. 16/428,244, filed on May 31, 2019, now Pat. No. 10,847,674, which is a
(Continued)

(30) Foreign Application Priority Data

Aug. 7, 2017     (KR) ........................ 10-2017-0099811

(51) Int. Cl.
*H10H 29/14*          (2025.01)
*H01L 25/075*          (2006.01)
(Continued)

(52) U.S. Cl.
CPC ......... *H10H 20/01* (2025.01); *H01L 25/0753* (2013.01); *H10H 20/813* (2025.01);
(Continued)

(58) Field of Classification Search
CPC ............. H01L 33/0095; H01L 25/0753; H01L 27/156; H01L 33/08; H01L 33/387
See application file for complete search history.

(56) References Cited

U.S. PATENT DOCUMENTS

| | | | |
|---|---|---|---|
| 9,570,425 | B2 | 2/2017 | Do |
| 9,768,384 | B2 | 9/2017 | Kwon |

(Continued)

FOREIGN PATENT DOCUMENTS

| | | |
|---|---|---|
| JP | 4814394 | 11/2011 |
| JP | 4914929 | 4/2012 |

(Continued)

OTHER PUBLICATIONS

Korean communication for KR 10-2017-0099811 dated Jun. 3, 2022, 2 pages.

(Continued)

*Primary Examiner* — Chad M Dicke
*Assistant Examiner* — Valerie N Newton
(74) *Attorney, Agent, or Firm* — Womble Bond Dickinson (US) LLP

(57) ABSTRACT

A light emitting device includes: a substrate; a first electrode and a second electrode provided at a distance from each other on the substrate and extending in one direction; a plurality of light emitting diodes provided between the first electrode and the second electrode, and connected to the first electrode and the second electrode; and a residual pattern provided between at least one of the plurality of light emitting diodes and the substrate.

13 Claims, 7 Drawing Sheets

Related U.S. Application Data continuation of application No. 15/864,885, filed on Jan. 8, 2018, now Pat. No. 10,340,414.

(51) Int. Cl.

| | |
|---|---|
| *H10H 20/01* | (2025.01) |
| *H10H 20/813* | (2025.01) |
| *H10H 20/831* | (2025.01) |
| *B82B 3/00* | (2006.01) |
| *H10H 20/857* | (2025.01) |

(52) U.S. Cl.
CPC ...... *H10H 20/8316* (2025.01); *H10H 29/142* (2025.01); *B82B 3/0052* (2013.01); *H10H 20/857* (2025.01)

(56) References Cited

U.S. PATENT DOCUMENTS

| | | | |
|---|---|---|---|
| 10,050,199 | B2 | 8/2018 | Kwon |
| 10,468,598 | B2 | 11/2019 | Kwon |
| 10,784,246 | B2 | 9/2020 | Do et al. |
| 10,862,034 | B2 | 12/2020 | Kwon |
| 11,227,998 | B2 | 1/2022 | Kwon |
| 2008/0029780 | A1* | 2/2008 | Ohtsuka ................. H01L 24/17 |
| | | | 257/E33.059 |
| 2009/0078956 | A1 | 3/2009 | Tseng et al. |
| 2010/0155693 | A1* | 6/2010 | Seo ........................ H10H 29/14 |
| | | | 257/E21.211 |
| 2011/0233569 | A1 | 9/2011 | Ko et al. |
| 2012/0326181 | A1* | 12/2012 | Shibata ............... H01L 25/0753 |
| | | | 257/E33.061 |
| 2014/0124801 | A1* | 5/2014 | Lee ..................... H01L 25/0753 |
| | | | 257/88 |
| 2016/0334679 | A1 | 11/2016 | Choi et al. |
| 2017/0025610 | A1 | 1/2017 | Kwon |
| 2017/0103966 | A1* | 4/2017 | Choi .................... H10H 20/812 |
| 2017/0229608 | A1* | 8/2017 | Wu ........................ H01L 33/38 |
| 2017/0358563 | A1* | 12/2017 | Cho ........................ H01L 33/20 |
| 2018/0174519 | A1* | 6/2018 | Kim ........................ H01L 33/06 |
| 2021/0005596 | A1 | 1/2021 | Do et al. |

FOREIGN PATENT DOCUMENTS

| | | |
|---|---|---|
| JP | WO 2013-115379 A1 | 5/2015 |
| KR | 10-2013-0116114 | 10/2013 |
| KR | 10-1436123 | 11/2014 |
| KR | 10-1627365 B1 | 6/2016 |
| KR | 10-1628345 | 6/2016 |
| KR | 2017-0012706 | 2/2017 |
| KR | 2017-0027872 A | 3/2017 |
| KR | 10-1730929 | 4/2017 |
| KR | 10-1730977 | 4/2017 |
| KR | 2017-0091805 | 8/2017 |

OTHER PUBLICATIONS

Notice of Allowance dated Jan. 27, 2024 regarding Korean Patent Application No. 10-2022-0111583 corresponding to U.S. Appl. No. 17/102,293 (2 pages).

* cited by examiner

LIGHT EMITTING DIODE DEVICE AND METHOD FOR THE SAME

CROSS-REFERENCE TO RELATED APPLICATIONS

This application is a continuation of U.S. patent application Ser. No. 16/428,244, filed May 31, 2019, which is a continuation of U.S. patent application Ser. No. 15/864,885, filed Jan. 8, 2018, now U.S. Pat. No. 10,340,414, which claims priority to and the benefit of Korean Patent Application No. 10-2017-0099811 filed in the Korean Intellectual Property Office on Aug. 7, 2017, the entire contents of which are incorporated herein by reference.

BACKGROUND

1. Field

This disclosure relates to a light emitting diode device and a method for manufacturing the same.

2. Description of the Related Art

In general, a light emitting diode (LED) is an element that emits light at a predetermined wavelength when receiving an electric signal through electrodes connected to opposite ends thereof.

A light emitting device having nano-sized light emitting diodes may be constructed by spraying (e.g depositing, sputtering, etc.) semiconductor layers on neighboring lateral electrodes by using a spray device. The nano-sized light emitting diodes are arranged on the lateral electrodes by forming an electromagnetic field between the lateral electrodes.

The above information disclosed in this Background section is only for enhancement of understanding of the background of the described technology and therefore it may contain information that does not form prior art.

SUMMARY

The described technology has been made in an effort to provide a light emitting device where a short-circuit between lateral electrodes having light emitting diodes arranged therebetween due to unexpected particles can be prevented or substantially prevented, and a method for manufacturing the same.

In addition, embodiments of the present invention provide a light emitting device of which a number of light emitting diodes arranged between lateral electrodes is increased, and a method for manufacturing the same.

One aspect of the present invention provides a light emitting device that includes: a substrate; a first electrode and a second electrode at a distance from each other on the substrate and extending in one direction; a plurality of light emitting diodes between the first electrode and the second electrode, and connected to the first electrode and the second electrode; and a residual pattern between at least one of the plurality of light emitting diodes and the substrate.

The residual pattern may have an area that is smaller than a single light emitting diode.

The residual pattern may include a material that is different from the substrate, the first electrode, the second electrode, and the light emitting diodes.

The residual pattern may include at least one of an organic material, an inorganic material, and a metal oxide.

The residual pattern may be a photoresist pattern.

The light emitting device may further include a protrusion portion between the substrate and the second electrode.

The light emitting device may further include a first contact portion on the first electrode, and contacting the first electrode and some of the plurality of light emitting diodes.

The light emitting device may further include a second contact portion on the second electrode, and contacting the second electrode and some of the plurality of light emitting diodes.

The light emitting device may further include at least one insulation pattern between the first contact portion and the second contact portion.

The plurality of light emitting diodes include first light emitting diodes, at least one of a first end and a second end of each of the first light emitting diodes may contact at least one electrode of the first electrode and the second electrode on the at least one electrode, and the residual pattern may overlap the first light emitting diodes.

The plurality of light emitting elements may include second light emitting diodes, a first end and a second end of each of the second light emitting diodes may contact the substrate, and the residual pattern does not overlap the second light emitting diodes.

In addition, one aspect of the present invention provides a method for manufacturing a light emitting device. The method includes: coating a plurality of light emitting diodes on a first electrode and a second electrode that are at a distance from each other on a substrate and extend in one direction; arranging the plurality of light emitting diodes between the first electrode and the second electrode by forming an electromagnetic field between the first electrode and the second electrode; forming a contact pattern that contacts at least one of the first electrode and the second electrode and the plurality of light emitting diodes; cleaning the substrate; and removing the contact pattern.

Removing the contact pattern may include forming a residual pattern that is between at least one of the plurality of light emitting diodes and the substrate.

The contact pattern may be one of a photoresist pattern, an inorganic pattern, or a metal oxide pattern.

According to an exemplary embodiment, a light emitting device of which lateral electrodes between which the plurality of light emitting diodes are arranged can be prevented or substantially prevented from being short-circuited due to undesirable particles, and a method for manufacturing the light emitting device can be provided.

Further, a light emitting device of which a number of light emitting diodes arranged between the lateral electrodes can be increased, and a method for manufacturing the light emitting device can be provided.

DETAILED DESCRIPTION

Figure 1:
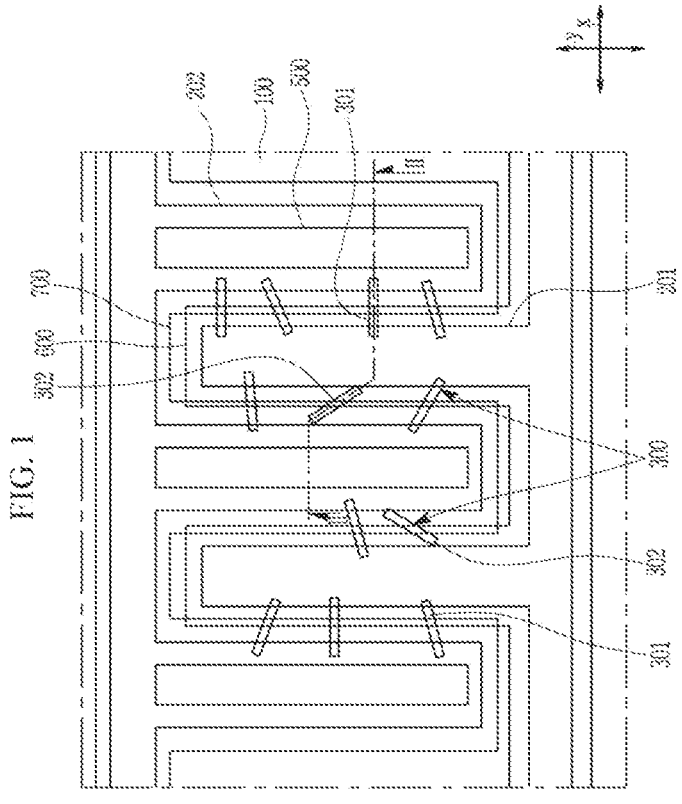
FIG. 1 is a top plan view of a light emitting diode device according to an exemplary embodiment.

Hereinafter, exemplary embodiments will be described in more detail with reference to the accompanying drawings.

The present invention, however, may be embodied in various different forms, and should not be construed as being limited to only the illustrated embodiments herein.

The drawings and description are to be regarded as illustrative in nature and not restrictive. Like reference numerals designate like elements throughout the specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the word "over" or "on" means positioning on or below the object portion, but does not essentially mean positioning on the upper side of the object portion based on a gravity direction.

In addition, unless explicitly described to the contrary, the word "comprise" and variations such as "comprises" or "comprising" will be understood to imply the inclusion of stated elements but not the exclusion of any other elements.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, referring to FIG. 1 and FIG. 2, a light emitting diode device according to an exemplary embodiment will be described.

FIG. 1 is a top plan view of a light emitting diode device according to an exemplary embodiment. FIG. 2 is a cross-sectional view of FIG. 1, taken along the line II-II.

Figure 2:
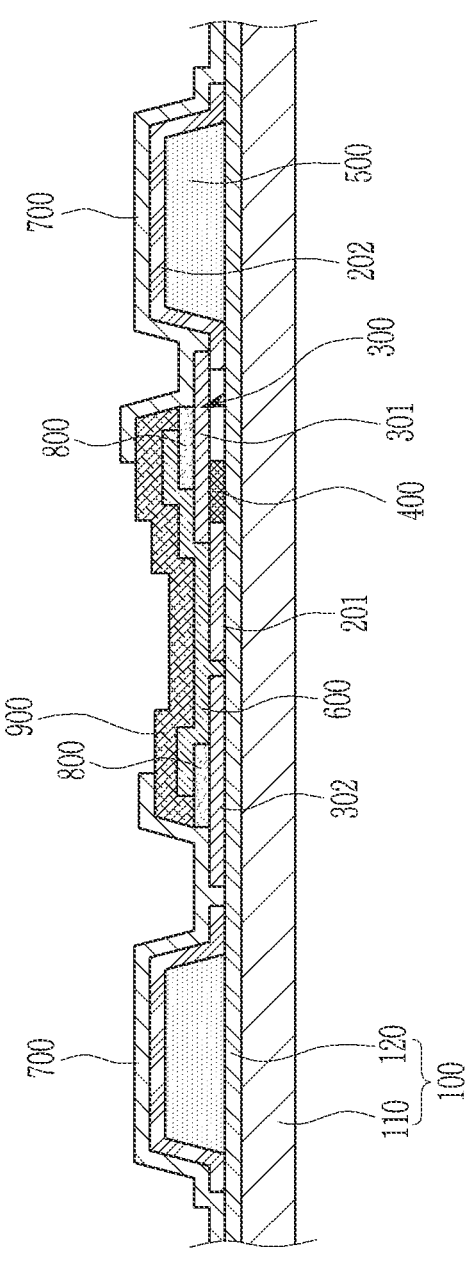
FIG. 2 is a cross-sectional view of FIG. 1, taken along the line II-II.

Referring to FIG. 1 and FIG. 2, a light emitting diode device according to an exemplary embodiment is a device that emits light by using a plurality of nano-sized light emitting diodes.

The light emitting diode device includes a substrate 100, a first electrode 201, a second electrode 202, a plurality of light emitting diodes 300, a residual pattern 400, a protrusion portion 500, a first contact portion 600, a second contact portion 700, first insulation patterns 800, and second insulation patterns 900.

The substrate 100 may include at least one of glass, an organic material, an inorganic material, a metal, and the like. The substrate 100 may be rigid or may be flexible, foldable, or bendable. The substrate 100 includes a substrate main body 110 and a buffer layer 120 disposed on the substrate main body 110. The substrate main body 110 may include at least one of the above-stated glass, organic material, inorganic material, and metal. The buffer layer 120 may be disposed throughout the entire surface of the substrate main body 110. The buffer layer 120 may include at least one of glass, an organic material, an inorganic material, and the like.

The first electrode 201 is disposed on the substrate 100, and extends in a first direction x and then extends while being branched multiple times in a second direction y that crosses the first direction x.

The second electrode 202 is disposed on the substrate 100, and is disposed apart from the first electrode 201. The second electrode 202 extends in the first direction x, and then extends while being branched multiple times in the second direction y.

The first electrode 201 and the second electrode 202 may be alternately arranged.

The first electrode 201 and the second electrode 202 respectively are depicted with straight-line shapes, but this is not restrictive. The first electrode 201 and the second electrode 202 may have curved-line shapes.

The first electrode 201 and the second electrode 202 are disposed on the same plane on the substrate 100, but this is not restrictive. They may be disposed on different planes on the substrate 110.

The first electrode 201 and the second electrode 202 may be concurrently (e.g. simultaneously) formed through one process, but this is not restrictive. They may be sequentially formed through different processes.

The plurality of light emitting diodes 300 are disposed between the first electrode 201 and the second electrode 202. The plurality of light emitting diodes 300 are connected to the first electrode 201 and the second electrode 202.

The plurality of light emitting diodes 300 are substantially nano-sized.

The plurality of light emitting diodes 300 may include various known light emitting diodes included in a light emitting device, but this is not restrictive. Any suitable known various light emitting diodes included in a display device can be used.

Each of the plurality of light emitting diodes 300 may have various shapes such as a cylinder, a triangular column, a quadrangular column, a conical shape, and the like.

The plurality of light emitting diodes 300 are deposited (e.g. coated) on the first electrode 201 and the second electrode 202 in solution by a depositing device (e.g. a coating device) such as an inkjet printer, and then may be arranged between the first electrode 201 and the second electrode 202 by an electromagnetic field formed between the first electrode 201 and the second electrode 202.

Here, the solution may be in the form of ink or paste in which the plurality of light emitting diodes 300 are mixed in a solvent.

Each of the plurality of light emitting diodes 300 has an aspect ratio, and the light emitting diodes 300 are aligned in various directions between the first electrode 201 and the second electrode 202.

The plurality of light emitting diodes 300 include a first light emitting diode 301 and a second light emitting diode 302. Although discussed as a first light emitting diode 301 and a second light emitting diode 302, embodiments of the present invention are not limited thereto. For example, in multiple embodiments, the plurality of light emitting diodes 300 include a plurality of first light emitting diodes and a plurality of second of light emitting diode. In these embodiments, each diode in the first light emitting diodes has the properties described in relation to the first light emitting diode 301 and each diode in the second light emitting diodes has the properties described in relation to the second light emitting diode 302.

At least one of a first end and a second end of the first light emitting diode 301 contacts at least one electrode on at least one of the first electrode 201 and the second electrode 202. For example, at least one of opposite ends of the first light emitting diode 301 is disposed on at least one of the first electrode 201 and the second electrode 202, and the first light emitting diode 301 overlaps at least one of the first electrode 201 and the second electrode 202.

The residual pattern 400 is disposed between the first light emitting diode 301 and the substrate 100.

A first end and a second end of the second light emitting diode 302 contact the substrate 100. For example, opposite ends of the second light emitting diode 302 contacts the substrate 100, and the second light emitting diode 302 does not overlap the first electrode 201 and the second electrode 202.

The residual pattern 400 is not disposed between the second light emitting diode 302 and the substrate 100.

The residual pattern 400 is disposed between at least one of the plurality of light emitting diodes 300 and the substrate 100.

The residual pattern 400 overlaps at least one of the plurality of light emitting diodes 300. The residual pattern 400 overlaps the first light emitting diode 301 among the plurality of light emitting diodes 300 and does not overlap the second light emitting diode 302.

The residual pattern 400 has a smaller area compared to a single light emitting diode among the plurality of light emitting diodes 300.

The residual pattern 400 includes a material that is different from that of the substrate 100, the first electrode 201, the second electrode 202, and the light emitting diodes 300. The residual pattern 400 may include at least one of an organic material, an inorganic material, and a metal oxide. For example, the residual pattern 400 may be a photoresist pattern.

The residual pattern 400 directly connects between the first light emitting diode 301 and the substrate 100. Thus, the first light emitting diode 301 can be prevented from being separated from the first electrode 201 and the second electrode 202 through a manufacturing process. As described, the plurality of light emitting diodes 300 can be prevented from being separated from the first electrode 201 and the second electrode 202, the number of light emitting diodes 300 between the first electrode 201 and the second electrode 202 can be increased.

The protrusion portion 500 is disposed between the substrate 100 and at least a portion of the second electrode 202. The protrusion portion 500 protrudes upward from a surface of the substrate 100. The second electrode 202 protruded upward by the protrusion portion 500 is at the surface of the protrusion portion 500.

Light emitted from the plurality of light emitting diodes 300 towards the protrusion portion 500 may be reflected upwards by the second electrode 202 protruded by the protrusion portion 500. Accordingly, the efficiency of light emitted from the plurality of light emitting diodes 300 can be improved.

The first contact portion 600 is disposed on the first electrode 201, and contacts the first electrode 201 and a first portion of the plurality of light emitting diodes 300. The first contact portion 600 may include a transparent conductive material, but this is not restrictive.

The second contact portion 700 is disposed on the second electrode 202, and contacts the second electrode 202 and a second portion of the plurality of light emitting diodes 300. The second contact portion 700 may include a transparent conductive material, but this is not restrictive.

A part of the first contact portion 600 and a part of the second contact portion 700 are overlapped with each other on the plurality of light emitting diodes 300.

The plurality of light emitting diodes 300 disposed between the first electrode 201 and the second electrode 202 are connected to the first electrode 201 and the second electrode 202 by the first contact portion 600 and the second contact portion 700.

For example, the first light emitting diode 301 among the plurality of light emitting diodes 300 may be directly connected to the first electrode 201 and the second electrode 202 by contacting the first electrode 201 and the second electrode 202, or may be indirectly connected to the first electrode 201 and the second electrode 202 by being disposed apart from the first electrode 201 and the second electrode 202. In the depicted embodiment, the first contact portion 600 contacts the second electrode 202 and one part of the second light emitting diode 302 and the second contact portion 700 contacts the first electrode 201 and the other part of the second light emitting diode 302. The second light emitting diode 302 is therefore connected with the first electrode 201 and the second electrode 202.

As described, the plurality of light emitting diodes 300 are connected to the first electrode 201 and the second electrode 202 by the first contact portion 600 and the second contact portion 700 even though some of the light emitting diodes 300 among the plurality of light emitting diodes 300 are arranged at a distance from the first electrode 201 and the second electrode 202. Accordingly, the plurality of light emitting diodes 300 arranged between the first electrode 201 and the second electrode 202 wholly emit light even though some of the plurality of light emitting diodes 300 may be separated from the first electrode 201 or the second electrode 202 during the manufacturing process.

At least one insulation pattern is disposed between the first contact portion 600 and the second contact portion 700.

The first insulation patterns 800 are on the plurality of light emitting diodes 300, and are disposed between the plurality of light emitting diodes 300 and the first contact portion 600 and between the first contact portion 600 and the second contact portion 700.

The second insulation patterns 900 are on the first insulation patterns 800, and are disposed between the first insulation pattern 800 and the second contact portion 700 and between the first contact portion 600 and the second contact portion 700.

As described, in the light emitting display according to an exemplary embodiment, the residual pattern 400 directly connects between the first light emitting diode 301 and the substrate 100 so that the first light emitting diode 301 can be substantially prevented from being separated from the first electrode 201 and the second electrode 202 during the manufacturing process.

That is, because the plurality of light emitting diodes 300 can be prevented or substantially prevented from being separated from the first electrode 201 and the second electrode 202 during the manufacturing process, the number of light emitting diodes 300 disposed between the first electrode 201 and the second electrode 202 can be increased.

In addition, in the light emitting device according an the exemplary embodiment, light emitted towards the protrusion portion 500 from the plurality of light emitting diodes 300 is reflected upward by the second electrode 202 protruded by the protrusion portion 500, thereby increasing the efficiency of the light emitting diodes 300.

Further, in the light emitting device according to an exemplary embodiment, the plurality of light emitting diodes 300 are connected to the first electrode 201 and the second electrode 202 by the first contact portion 600 and the second contact portion 700. Thus, even though some of the light emitting diodes 300 are arranged at a distance from the first electrode 201 and the second electrode 202 during the manufacturing process, the plurality of light emitting diodes 300 can be connected to the first electrode 201 and the second electrode 202.

That is, although some of the plurality of light emitting diodes 300 arranged between the first electrode 201 and the second electrode 202 are disposed at a distance from the first electrode 201 or the second electrode 202, all light emitting diodes 300 disposed between the first electrode 201 and the second electrode 202 can emit light.

In addition, in the light emitting device according to the exemplary embodiment, the first electrode 201 and the second electrode 202, between which the plurality of light emitting diodes 300 are arranged, can be prevented or substantially prevented from being short-circuited due to undesirable particles by the residual pattern 400.

This will be described in detail below with reference to a method for manufacturing a light emitting device according to another exemplary embodiment.

Hereinafter, referring to FIG. 3 to FIG. 7, a method for manufacturing a light emitting device according to another exemplary embodiment will be described.

The above-described light emitting device may be manufactured by using the method for manufacturing a light emitting device according to another exemplary embodiment, but the present invention is not limited thereto.

Figure 3:
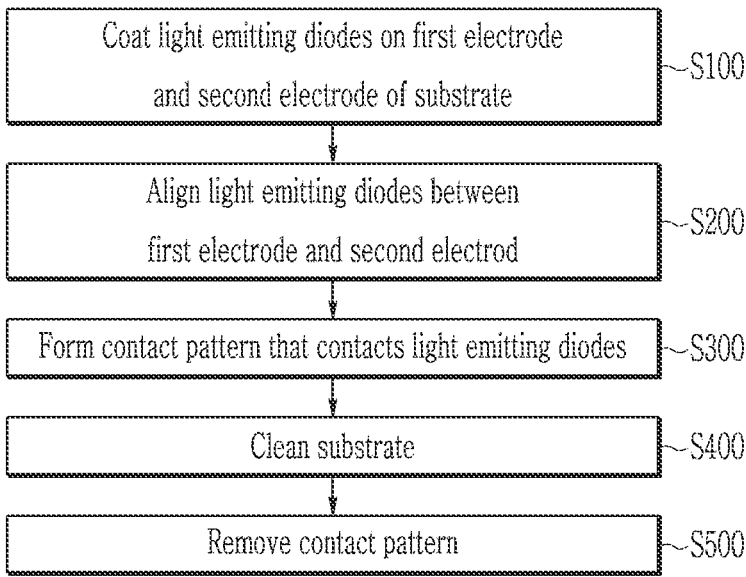
FIG. 3 is a flowchart of a method for manufacturing a light emitting diode device according to another exemplary embodiment.

FIG. 3 shows a flowchart of a method for manufacturing a light emitting device according to another exemplary embodiment.

FIG. 4 to FIG. 7 are cross-sectional views of a method for manufacturing a light emitting device according to another exemplary embodiment.

Figure 4:
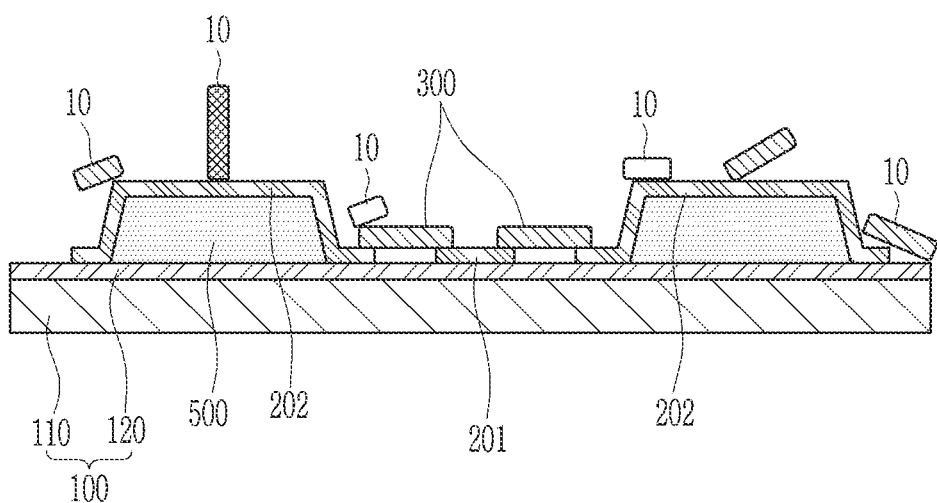
FIG. 4 to FIG. 7 are cross-sectional views of a method for manufacturing a light emitting diode device according to the other exemplary embodiment.

First, referring to FIG. 3 and FIG. 4, a plurality of light emitting diodes 300 are coated on a first electrode 201 and second electrodes 202 of a substrate 100 (S100).

For example, the plurality of light emitting diodes 300 are coated on the first electrode 201 and the second electrodes 202 that extend in one direction while having a distance from each other on the substrate 100.

A protrusion portion 500 is on the substrate 100. The substrate 100 includes the buffer layer 120 on the substrate main body 110, and the first electrode 201 and the second electrode 202 are provided. In this case, the second electrode 202 overlaps the protrusion portion 500, and the first electrode 201 is disposed between neighboring second electrodes 202.

In one embodiment, the plurality of light emitting diodes 300 are coated in the form of ink or paste mixed with a solvent on the first electrode 201 and the second electrodes 202 by a coating device such as an inkjet printer. When the solvent is evaporated, the plurality of light emitting diodes 300 are arranged on the first electrode 201 and the second electrodes 202. In this case, particles 10 unexpectedly mixed in the solvent or injected during the manufacturing process are also disposed on the first electrode 201 and the second electrodes 202 together with the plurality of light emitting diodes 300.

Next, the plurality of light emitting diodes 300 are arranged between the first electrode 201 and the second electrodes 202 (S200).

For example, an electromagnetic field is formed between the first electrode 201 and the second electrode 202 by applying power to the first electrode 201 and the second electrode 202. The plurality of light emitting diodes 300 are arranged between the first electrode 201 and the second electrodes 202 by the electromagnetic field formed between the first electrode 201 and the second electrodes 202.

Figure 6:
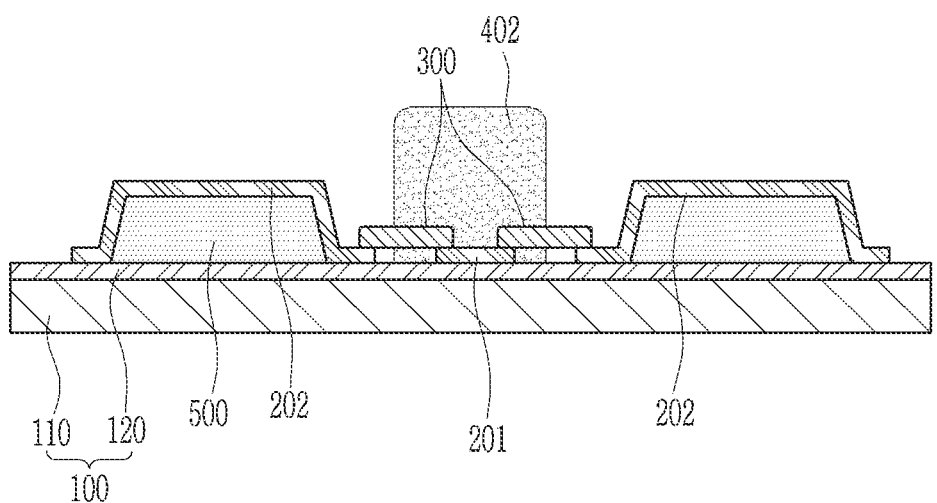

Next, referring to FIG. 6, a contact pattern 402 that contacts the plurality of light emitting diodes 300 is formed (S300).

Figure 5:
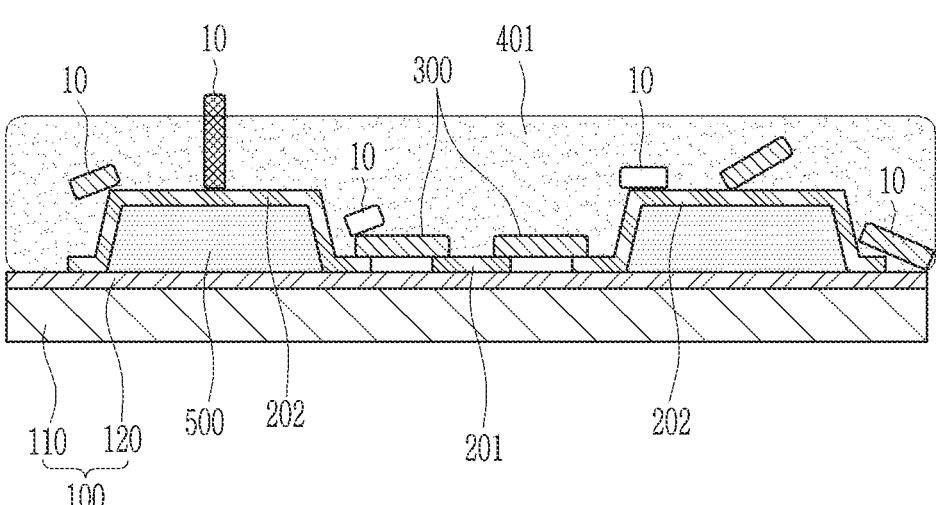

Referring to FIG. 5, a photoresist layer 401 is formed throughout the substrate 100.

In another exemplary embodiment, instead of the photoresist layer 401, one of an organic layer, an inorganic layer, and a metal oxide layer may be formed throughout the substrate 100.

Next, referring to FIG. 6, the photoresist layer 401 is exposed and developed by using a mask such that the contact pattern 402 that contacts at least one of the first electrode 201 and the second electrode 202 and the plurality of light emitting diodes 300 is formed. That is, the contact pattern 402 may be a photoresist pattern.

The contact pattern 402 may contact the first electrode 201 and a part of each of the plurality of light emitting diodes 300 that neighbor the first electrode 201, but this is not restrictive.

On the other hand, in another exemplary embodiment, the contact pattern 402 that contacts at least one of the first electrode 201 and the second electrode 202 and the plurality of light emitting diodes 300 may be formed by etching one of an organic layer, an inorganic layer, and a metal oxide layer using a photolithography process.

That is, in the other exemplary embodiment, the contact pattern 402 may be one of an organic pattern, an inorganic pattern, and a metal oxide pattern.

Next, the substrate 100 is cleaned (S400).

For example, the contact pattern 402 is formed by development, the particles 10 disposed on the first electrode 201 and the second electrode 202 are separated from the first electrode 201 and the second electrode 202.

The substrate 100 may be cleaned by wet-etching or dry-etching.

Accordingly, the particles 10 disposed on the first electrode 201 and the second electrode 202 are separated therefrom.

When the substrate 100 is cleaned, the contact pattern 402 contacts at least one of the first electrode 201 and the second electrode 202 and the plurality of light emitting diodes 300 so that the light emitting diodes 300 can be prevented from being separated between the first electrode 201 and the second electrode 202.

In addition, the particles 10 disposed on the first electrode 201 and the second electrode 202 are separated when the substrate 100 is cleaned, a short-circuit between the first electrode 201 and the second electrode 202 due to the particles 10 can be suppressed.

Figure 7:
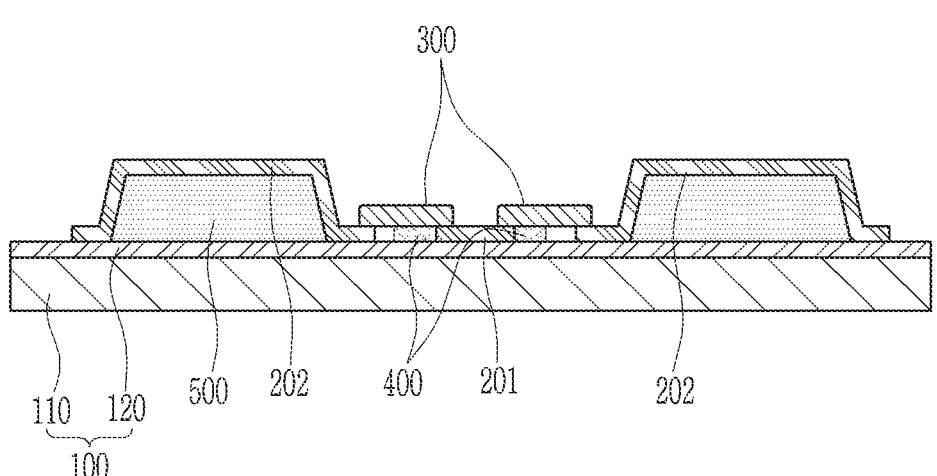

Next, referring to FIG. 7, the contact pattern 402 is removed (S500).

For example, the contact pattern 402, which may be a photoresist pattern, is removed by performing an ashing process.

In this case, the contact pattern 402 partially remains between at least one of the plurality of light emitting diodes 300 and the substrate 100 such that the residual pattern 400 is formed.

On the other hand, in another exemplary embodiment, the contact pattern 402, which can be one of the organic pattern, the inorganic pattern, and the metal oxide pattern can be removed by performing wet-etching or dry-etching.

Next, at least one contact portion and at least one insulation pattern may be provided on the plurality of light emitting diodes 300.

As described, according to the method for manufacturing the light emitting device according to another exemplary embodiment, the contact pattern 402 contacts at least one of the first electrode 201 and the second electrode 202 and the plurality of light emitting diodes 300 when the substrate 100 is cleaned so that the plurality of light emitting diodes 300 can be prevented or substantially prevented from being separated between the first electrode 201 and the second electrode 202.

That is, because the plurality of light emitting diodes 300 can be prevented or substantially from being separated from the first electrode 201 and the second electrode 202 during the manufacturing process, the number of light emitting diodes 300 arranged between the first electrode 201 and the second electrode 202 can be increased.

Further, in the method for manufacturing the light emitting device according to another exemplary embodiment, the particles 10 disposed on the first electrode 201 and the second electrode 202 are separated when the substrate 100 is cleaned so that a short-circuit between the first electrode 201 and the second electrode 202 due to the particles 10 can be suppressed.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A light emitting device comprising:
a substrate;
a buffer layer on the substrate;
a first electrode located on the buffer layer;
a second electrode located on the buffer layer and spaced from the first electrode;

a first light emitting diode electrically connected to the first electrode and the second electrode; and a first insulating pattern entirely above the first light emitting diode;

a first contact portion located on the first electrode and contacting the first light emitting diode;

a second insulating pattern disposed on the first insulating pattern and the first contact portion; and a second contact portion located on the second electrode and contacting the first light emitting diode, wherein the first contact portion includes a portion disposed below the second insulating pattern, wherein the second contact portion includes a portion disposed on the second insulating pattern, wherein a portion of the first insulating pattern overlaps the first light emitting diode, and wherein the portion of the first insulating pattern which overlaps the first light emitting diode is disposed between the first light emitting diode and the second insulating pattern.

2. The light emitting device of claim 1, wherein the buffer layer is between the first light emitting diode and the substrate.

3. The light emitting device of claim 2, wherein the first light emitting diode is on the first electrode and the second electrode, the light emitting device further comprising a pattern located between the first light emitting diode and the buffer layer.

4. The light emitting device of claim 1, further comprising a first protrusion portion between the second electrode and the substrate, wherein the buffer layer is between the first protrusion portion and the substrate.

5. The light emitting device of claim 1, wherein at least a portion of the first contact portion directly contacts the first electrode, and at least a portion of the second contact portion directly contacts the second electrode.

6. The light emitting device of claim 1, wherein a width of the first insulating pattern is smaller than a length of the first light emitting diode.

7. The light emitting device of claim 1, further comprising a third electrode located on the substrate and spaced from the first electrode;

a second light emitting diode electrically connected to the first electrode and the third electrode; and a third contact portion located on the third electrode and contacting the second light emitting diode, wherein the first contact portion contacts the second light emitting diode.

8. The light emitting device of claim 7, wherein the second light emitting diode is directly located on the buffer layer.

9. The light emitting device of claim 7, wherein the first insulating pattern is located on the first light emitting diode and the second light emitting diode, and the first insulating pattern comprises a plurality of first insulating patterns that are space from each other.

10. The light emitting device of claim 7, wherein the second contact portion and the third contact portion are located on the second insulating pattern.

11. The light emitting device of claim 7, wherein:

the second insulating pattern includes a first surface facing the substrate and a second surface opposite to the first surface, the portion of the first contact portion is disposed between the first surface of the second insulating pattern and the substrate, the portion of the first contact portion overlaps the first surface of the second insulating pattern, and the portion of the second contact portion is disposed on the second surface of the second insulating pattern.

12. The light emitting device of claim 11, wherein:

the portion of the first contact portion directly contacts the first surface of the second insulating pattern.

13. The light emitting device of claim 11, wherein:

the first contact portion does not directly contact the second surface of the second insulating pattern.

* * * * *